United States Patent [19]

Rea

[11] 4,430,691

[45] Feb. 7, 1984

[54] ELECTROMECHANICAL DISPLAY INSTRUMENT ASSEMBLY

[75] Inventor: Clyde M. Rea, Phoenix, Ariz.

[73] Assignee: Sperry Corporation, New York, N.Y.

[21] Appl. No.: 237,328

[22] Filed: Feb. 23, 1981

[51] Int. Cl.³ .............................................. H02B 1/00
[52] U.S. Cl. ..................................... 361/383; 29/464; 29/526 R; 361/415; 374/208; 411/350
[58] Field of Search ................. 73/431, 179; 248/27.1; 340/27 SS; 364/427, 428, 434; 374/165, 170; 361/386, 383; 411/350; 29/464

[56] References Cited

U.S. PATENT DOCUMENTS

| | | | |
|---|---|---|---|
| 2,426,554 | 8/1947 | Howren, Jr. | 73/431 X |
| 2,684,862 | 7/1954 | Lamb | 73/431 X |
| 2,808,576 | 10/1957 | Brown | 361/386 |
| 3,052,121 | 9/1962 | Goldin | 73/178 R |
| 3,123,743 | 3/1964 | Perlmutter | 361/383 |
| 3,124,720 | 3/1964 | Green | 361/383 |
| 3,221,549 | 12/1965 | Wetmore | 364/427 X |
| 3,440,601 | 4/1969 | Knapp | 340/27 SS |
| 3,490,509 | 1/1970 | Otteson et al. | 411/350 |
| 3,521,945 | 7/1970 | Bristol et al. | 73/431 X |
| 3,552,704 | 1/1971 | Pond | 411/350 X |
| 3,612,851 | 10/1971 | Fowler | 73/431 X |
| 3,693,050 | 9/1972 | Ettinger et al. | 361/386 |
| 3,845,359 | 10/1974 | Fedele | 361/415 X |
| 3,867,716 | 2/1975 | King | 340/27 R |
| 3,916,185 | 10/1975 | Jehly | 340/27 R X |
| 4,066,838 | 1/1978 | Fujita et al. | 248/27.1 |
| 4,117,257 | 9/1978 | Thomas | 374/208 X |
| 4,149,219 | 4/1979 | Kraft | 361/386 |
| 4,251,868 | 2/1981 | Aron et al. | 73/178 T |
| 4,298,905 | 11/1981 | Bosler et al. | 361/386 |

Primary Examiner—Daniel M. Yasich
Attorney, Agent, or Firm—Howard P. Terry

[57] ABSTRACT

In a flight instrument having indicator assembly and heat generating electronics assembly, integral and thermally conductive structural supports are provided for each assembly. The assemblies are fastened together with shouldered screws such that there is some relative movement between the assemblies. The fastened assemblies are enclosed in a one piece housing, and the relationship between the structural supports and the housing facilitates heat transfer from the instrument.

1 Claim, 3 Drawing Figures

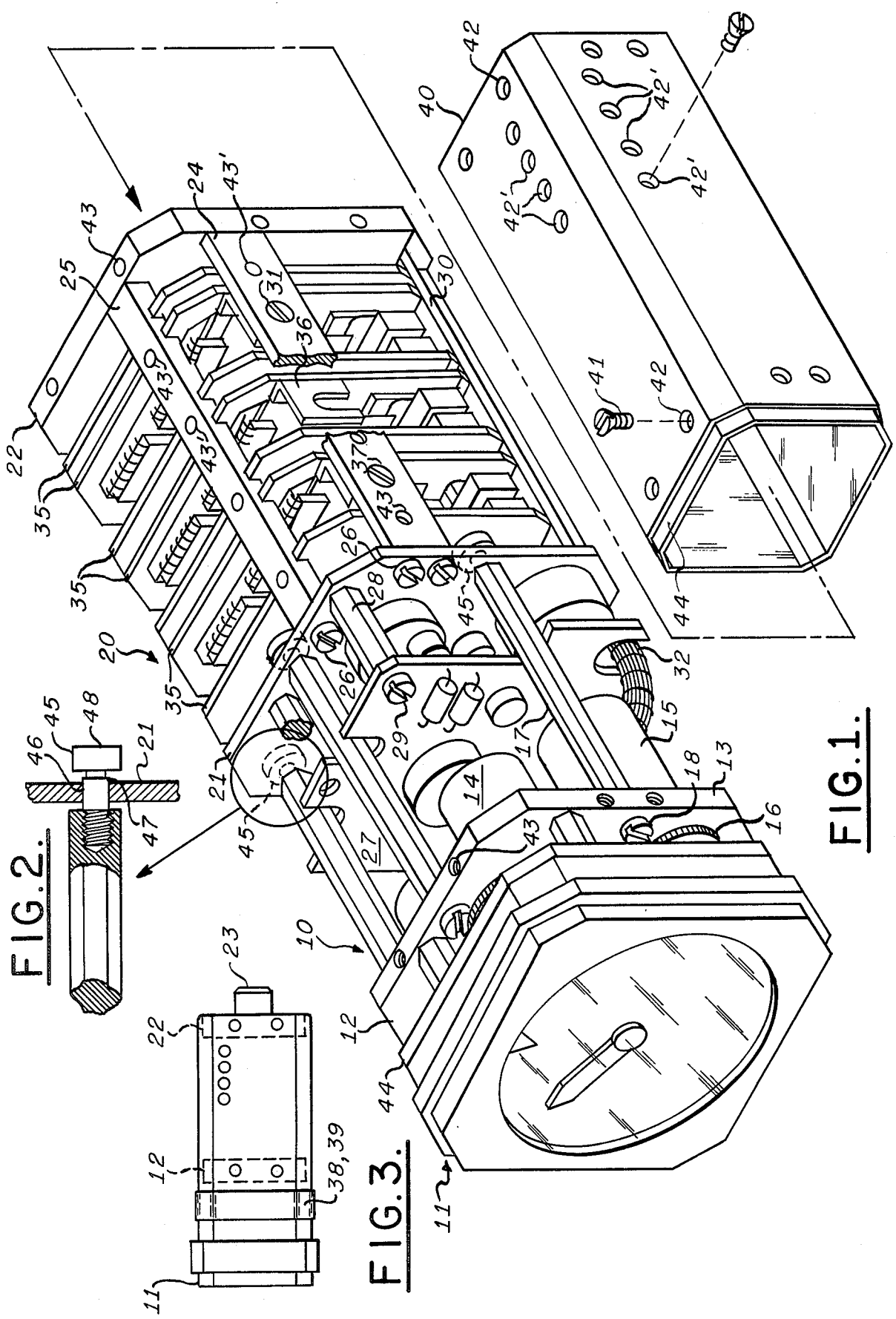

ELECTROMECHANICAL DISPLAY INSTRUMENT ASSEMBLY

BACKGROUND OF THE INVENTION

1. Field of the Invention

This invention relates to aircraft instruments, and more particularly to electronic flight instrument housings.

2. Description of the Prior Art

The advent of the dedicated microprocessor and its associated digital electronics has introduced novel heat dissipation requirements into the design and manufacture of electronic flight instruments. In prior art analog electronic flight instruments, the electronics "ran" cooler so that generally conventional packaging techniques could be employed. In a rate-of-climb indicator, for example, the internal structure of the instrument is typically secured to a front bezel, and the entire assembly is simply enclosed in a one piece closed end can type of housing. The end piece of the housing is attached to the internal structure of the instrument using suitable shims or the like to compensate for any front-to-back tolerance build-up or accumulation and to facilitate heat dissipation. Another prior art thermal management technique is the use of relatively thick metallic support plates and structures which served as heat sinks for the internal electronics. This technique adds not only expense, but more importantly it adds to the total weight which is highly undesirable in flight instruments.

It should be noted that in the thermal design of an electronic flight instrument housing, there is a need for close, intimate and tight physical contact between the housing and the thermal conducting elements or heat sinks associated with the heat generating electronics. In actual practice, however, this physical contact is not as easily achieved as it may first appear, especially in view of the manufacturing tolerance build-up or accumulation which may cause misalignment during assembly. Moreover, there is an additional need for sealing flight instruments to satisfy the humidity and salt evironmental test requirements, and this sealing requirement prohibits the simple tolerance build-up compensation method of slotting the screw holes in the housing.

Accordingly, there is a need for an electric instrument housing that is both efficient to assemble and that is well adapted to dissipate the heat generated by the digital electronics associated with a dedicated microprocessor.

SUMMARY OF THE INVENTION

In accordance with the present invention, the internal structural frame of an electronic instrument is divided into separate integral structures, and the separate structures are provided with lost motion connections to permit limited lengthwise relative movement. These separate structures or assemblies include thermal conducting elements or heat sink members which are pre-drilled and tapped to receive the housing assembly screws. This technique permits the entire instrument to be assembled, handled as a unit, and fully tested prior to enclosing the final assembly within the housing. The relative movement between the separate internal assemblies and the screw holes in the heat sink members allows the corresponding holes in the outer housing to be precisely aligned in the event that there is tolerance accumulation during instrument assembly.

BRIEF DESCRIPTION OF THE DRAWINGS

FIG. 1 is an illustration of an open assembly of a flight instrument utilizing the present invention;

FIG. 2 is an enlarged portion of FIG. 1; and

FIG. 3 is a side view of the assembled instrument of FIG. 1.

DESCRIPTION OF THE PREFERRED EMBODIMENTS

The front integral assembly 10 in FIG. 1 may comprise the electromechanical elements of a flight instrument, such as rate-of-climb indicator that induceas an instrument bezel assembly 11 and pointer servomechanism assembly 12. The latter comprises a mounting plate 13 to the rear side of which conventional pointer servomotor 14, feedback synchro 15 and warning flag actuator are attached (the warning flag is retracted and not displayed); these elements are connected conventionally by suitable mechanical gearing 16. Extending rearwardly from plate 13 are instrument posts or frame members 17 rigidly attached thereto by screws 18. The foregoing elements comprise a first instrument assembly of which the mounting plate 13 comprises a first structural support.

The second instrument assembly, designated by reference numeral 20, includes the digital processing electronics and pointer drive servo electronics and physical support frame therefor. The basic frame members comprise metal (aluminum) intermediate partition plate 21 and rear instrument housing plate 22; the former includes primarily power supply components and the latter rigidly supports the instrument connector 23 (FIG. 3). These plates are rigidly tied together by guide side rails or posts 24 and top clamp rail 25 secured therebetween by suitable screws 26. The partition plate 21, rear housing plate 22, post 24, and rail 25 comprise a second structural support. A base wire-wrap or multilayer printed wiring connector board 30 is mounted between slots in plates 21 and 22. A forward circuit board 27, containing primarily analog servo drive amplifier components, is rigidly supported on plate 21 through frame parts 28 and screws 29. Suitable bundled cables 32 electrically interconnect the electromechanical first instrument section with the electronic circuits of the electronic second instrument section.

In accordance with the invention, digital electronics circuit boards 35, seven in the present embodiment, are all of the same physical construction and basically include a conventional multilayer printed circuit board and aluminum thermal plane over which the microprocessors and dual in-line packages (DIPS) straddle and which serve as thermal conduits or conductors to the mounting rails 24 and 25. Good thermal conductivity may be further enhanced by providing slotted "L" brackets 36 on the board's thermal plane which are tightly and hence thermally secured to the side guides by means of screws 37.

The instrument components are assembled in generally conventional fashion to form the open assembly illustrated in FIG. 1 and after testing the cover 40 is slid over this assembly and rigidly held in place by machine screws 41. It will be noted that the cover can 40 is open at both ends and is provided with countersunk holes 42 and 42' which cooperate with corresponding tapped holes 43, 43' in frame member 12, side rails 24, 25 and rear end plate 22. The countersunk joint 44 between can 40 and bezel 11 is sealed using conventional adhesive lead tape 38 and adhesive polyester cover tape 39 as illustrated in FIG. 3. Countersunk holes 42, 42' and flat head machine screws 41 are desirable to assure a tight seal from external environments which may include high humidity, salt spray, and salt mist. A plurality of screw fastenings which tightly join the cover 40 and rails 24, 25 in positive heat-transferring relationship enhance the thermal conductivity between the rails 24, 25, and the cover itself acts as an efficient heat radiator dissipating the electronics-generated heat through conduction and convection.

In the manufacture of instruments, the various mechanical frame and support elements are machined within predetermined but finite tolerances, and these tolerances may build-up during the assembly process. Since the cover screw hole locations or dimensions are fixed, it is probable that the tolerance build-up will cause the misalignment of the countersunk holes 42' in the cover 40 with their corresponding tapped holes 43' in rails 24, 25. Therefore, in accordance with the present invention means are provided for permitting limited longitudinal flexibility between the front or bezel end assembly 11 and the rear or electronics end assembly 20. Such means further permits these assemblies to be handled as a unitary assembly, for example, for complete instrument test prior to enclosure within the cover 40. Therefore, when the cover 40 is slipped in place over the instrument framework, and the front assembly screws inserted, the rear assembly 20 may be longitudinally adjusted relative to the front assembly 11 so that the screw holes 42 and 42' may be aligned with their corresponding tapped holes 43, 43'. Tightening down all screws brings the cover in tight physical contact with rails 24, 25 and end plate 22 thereby providing a good transfer of heat from the electronics section 20 to the instrument external surface where the heat is dissipated by convection.

In the preferred embodiment of this invention, the longitudinal flexibility providing means comprises shouldered screws 45 extending through holes 46 (see FIG. 2) in plate 21 of rear assembly 20, the screws being threaded into tapped ends of frame posts 17 or support member 27 rigidly supported on plate 13 of the front assembly 10, the screws are provided with shoulders 47 having a greater longitudinal length than the thickness of the support plate 21. The length of the shoulder relative to the length of the posts 17 is predetermined in accordance with the maximum positive or negative expected tolerance build-up between parts. It should be noted that the screw head 48, which may have an Allen-head fitting and the effective diameter of posts 17 are larger than hole 46, thereby providing a positive but limited longitudinal flexibility between the front assembly 10 and rear assembly 20. It can be appreciated, therefore, that the length of front assembly 10 and rear assembly 20 may be adjusted within predetermined tolerances, and it can be further appreciated that the cover 10 becomes the primary structural member which establishes the over-all structural rigidity and integrity of the fully assembled instrument.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. An instrument container comprising:

a front assembly having a mounting plate with tapped screw holes therein;

a longitudinally extending first frame rigidly, attached to said mounting plate, a second frame, longitudinally disposed relative to said first frame, including heat conductors adapted to thermally couple to heat generating elements, said heat conductors having tapped screw holes therein located at predetermined positions thereon, a cover having holes therein positioned over said first and second frames, a connector between said first and second frames adapted to provide relative longitudinal position adjustment of said first and second frames after connection thereof to align said tapped screw holes of said first and second frames, including said tapped screw holes in said heat conductors with said holes in said cover, thereby compensating for tolerance build-up during assembly, and screws passing through said holes in said cover and threaded into said tapped screw holes in said first and second frames to provide tight physical contact of said first and second frames, including said heat conductors with said cover to establish structural rigidity and integrity, and provide for heat conduction from said second frame to said cover for dissipation therefrom by convection.

* * * * *